US010861855B2

(12) United States Patent
Feng et al.

(10) Patent No.: US 10,861,855 B2
(45) Date of Patent: Dec. 8, 2020

(54) SEMICONDUCTOR DEVICE AND METHOD OF MANUFACTURING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Li-Wei Feng, Kaohsiung (TW); Shih-Fang Tzou, Tainan (TW); Chien-Cheng Tsai, Kaohsiung (TW); Chih-Chi Cheng, Tainan (TW); Chia-Wei Wu, Taichung (TW); Ger-Pin Lin, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/841,702

(22) Filed: Apr. 7, 2020

(65) Prior Publication Data
US 2020/0235101 A1   Jul. 23, 2020

Related U.S. Application Data

(62) Division of application No. 16/052,636, filed on Aug. 2, 2018, now Pat. No. 10,658,365.

(30) Foreign Application Priority Data

Sep. 11, 2017   (CN) .......................... 2017 1 0811028

(51) Int. Cl.
  H01L 27/108 (2006.01)
(52) U.S. Cl.
  CPC .... H01L 27/10823 (2013.01); H01L 27/1085 (2013.01); H01L 27/10814 (2013.01);
  (Continued)

(58) Field of Classification Search
  CPC ................................................ H01L 27/10876
  See application file for complete search history.

(56) References Cited

U.S. PATENT DOCUMENTS 6,764,939 B1   7/2004  Yoshitaka
9,929,162 B1 *  3/2018  Feng ................. H01L 27/10814
  (Continued)

FOREIGN PATENT DOCUMENTS

CN   101673744 A   3/2010
CN   101996950 A   3/2011
  (Continued)

OTHER PUBLICATIONS

Ko, A Novel CVD-SiBCN Low-K Spacer Technology for High-Speed Applications, Jun. 17, 2008.
(Continued)

Primary Examiner — George R Fourson, III
(74) Attorney, Agent, or Firm — Winston Hsu

(57) ABSTRACT

A semiconductor device and method of manufacturing the same is provided in the present invention. The method includes the step of forming first mask patterns on a substrate, wherein the first mask patterns extend in a second direction and are spaced apart in a first direction to expose a portion of first insulating layer, removing the exposed first insulating layer to form multiple recesses in the first insulating layer, performing a surface treatment to the recess surface, filling up the recesses with a second insulating layer and exposing a portion of the first insulating layer, removing the exposed first insulating layer to form a mesh-type isolation structure, and forming storage node contact plugs in the openings of mesh-type isolation structure.

11 Claims, 6 Drawing Sheets

(52) U.S. Cl.
  CPC .. *H01L 27/10855* (2013.01); *H01L 27/10876* (2013.01); *H01L 27/10882* (2013.01)

(56) References Cited

U.S. PATENT DOCUMENTS

| | | | | |
|---|---|---|---|---|
| 2003/0170955 | A1* | 9/2003 | Kawamura | H01L 29/66621 438/270 |
| 2010/0109062 | A1* | 5/2010 | Kadoya | H01L 29/4238 257/296 |
| 2011/0147834 | A1* | 6/2011 | Taniguchi | H01L 27/10894 257/330 |
| 2011/0266602 | A1 | 11/2011 | Kim | |
| 2012/0074518 | A1 | 3/2012 | Kim | |
| 2012/0286357 | A1* | 11/2012 | Lee | H01L 21/823828 257/331 |
| 2013/0056823 | A1* | 3/2013 | Kim | H01L 27/10894 257/334 |

FOREIGN PATENT DOCUMENTS

| | | |
|---|---|---|
| CN | 105304724 A | 2/2016 |
| CN | 105810565 A | 7/2016 |
| CN | 106783743 A | 5/2017 |

OTHER PUBLICATIONS

Yamashita, A Novel ALD SiBCN Low-k Spacer for Parasitic Capacitance Reduction in FinFETs, Jun. 15, 2015.

\* cited by examiner

SEMICONDUCTOR DEVICE AND METHOD OF MANUFACTURING THE SAME

CROSS REFERENCE TO RELATED APPLICATIONS

This application is a divisional application of U.S. application Ser. No. 16/052,636 filed Aug. 2, 2018, the disclosure of which is incorporated herein by reference in its entirety.

BACKGROUND OF THE INVENTION

1. Field of the Invention

The present invention relates generally to a method of manufacturing semiconductor devices, and more particularly to a method of manufacturing dynamic random access memory (DRAM).

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. The capacitors in DRAM are electrically connected to the capacitor landing pads through their bottom electrodes, and are further electrically connected to the drains of transistors through contact plugs and contact pads of the storage nodes and forming access paths. Bit lines and word lines are buried respectively within the interlayer dielectric and substrate, wherein the bit line is electrically connected to the source of transistor through a bit line contact, and the word line serves as a gate for storage cells.

In current process of manufacturing storage node contact plugs in DRAM, isolation structures are first formed in interlayer dielectric to define the opening position of the contact plugs. However, these isolation structures will be peeled from the substrate easily in real manufacturing processes. This issue may damage the predetermined opening patterns. Therefore, there still exist many defects in current process of manufacturing the isolation structures, and the relevant method needs to be further improved.

SUMMARY OF THE INVENTION

In order to solve the above-described peeling issue for the isolation structure, the present invention provides a novel semiconductor process, which features the surface treatment to the surface that will contact with the isolation structure and change the depth of contact plug in the isolation structure to improve the steadiness between the plug and surrounding structures, thereby solving the peeling issue of isolation structure.

One aspect of present invention is to provide a method of manufacturing semiconductor devices, including the steps of providing a substrate, wherein at least one memory region is defined on the substrate, the substrate further includes a first insulating layer, and bit lines are provided in the first insulating layer in the memory region, and the bit lines extend in a first direction and are spaced apart from each other in a second direction perpendicular to the first direction, forming first mask patterns on the substrate, wherein the first mask patterns extend in the second direction and are spaced apart from each other in the first direction, and a portion of first insulating layer is exposed from the first mask patterns, after the first mask patterns are formed, removing the exposed first insulating layer to form recesses in the first insulating layer, performing a surface treatment process to the surface of recesses, after the surface treatment process is performed, filling up the recesses with a second insulating layer and exposing a portion of first insulating layer, wherein the materials of second insulating layer and first insulating layer are different, after filling the second insulating layer, removing the exposed first insulating layer to form a mesh-type isolation structure on the substrate, wherein the mesh-type isolation structure defines openings, and forming storage node contact plugs respectively in the openings.

Another aspect of the present invention is to provide a method of manufacturing semiconductor devices, including the steps of providing a substrate, wherein at least one cell region is defined on the substrate, the substrate further includes a first insulating layer, and multiple bit lines are provided in the first insulating layer in the cell region, and the bit lines extend in a first direction and are spaced apart from each other in a second direction perpendicular to the first direction, the substrate in the cell region further includes multiple word lines extending in the second direction and spaced apart from each other in the first direction, and each word line includes a capping layer, forming first mask patterns on the substrate, wherein the first mask patterns extend in the second direction and are spaced apart from each other in the first direction, and a portion of the first insulating layer is exposed from the first mask patterns, after the first mask patterns are formed, performing a first etch process with the first mask patterns as an etch mask to remove the exposed first insulating layer, thereby forming multiple recesses in the first insulating layer, wherein the first etch process simultaneously removes a portion of capping layer of the word lines so that the recesses extend into the capping layer, filling up the recesses with a second insulating layer, wherein the second insulating layer extends into the capping layer and exposes a portion of first insulating layer, and the materials of second insulating layer and first insulating layer are different, after filling the second insulating layer, removing the exposed first insulating layer to form a mesh-type isolation structure on the substrate, wherein the mesh-type isolation structure extends into the capping layer and defines multiple openings, and forming storage node contact plugs respectively in the openings.

Still another aspect of the present invention is to provide a semiconductor device, including a substrate, wherein at least one cell region is defined in the substrate, the cell region is provided with multiple storage nodes, and multiple word lines is provided in the substrate, each of word lines includes a capping layer, mesh-type isolation structure on the cell region and defining multiple openings, wherein the mesh-type isolation structure extends downwardly into the capping layer of word lines, and multiple storage node contact plugs respectively in the openings and electrically connecting with the storage nodes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
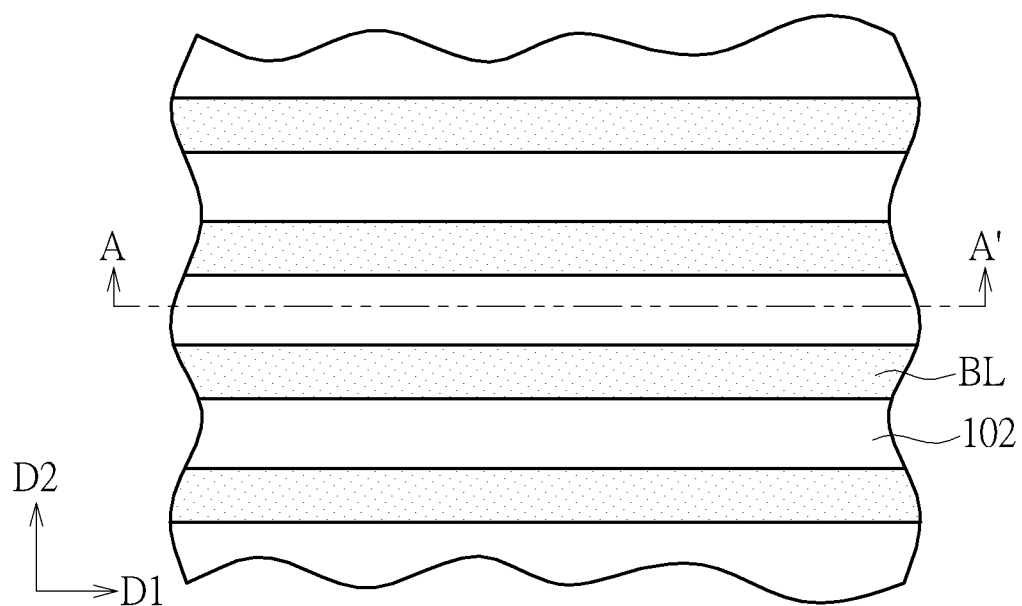
FIGS. 1A, 2A, 3A, 4A, 5A and 6A are schematic top views sequentially illustrating the steps of manufacturing a semiconductor device in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. In the drawings, the size and relative sizes of components and regions may be exaggerated for clarity unless express so defined herein. It is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer. Various layers may be formed on the substrate. The term "substrate" will be used to summarize these layers on the basis that they don't have special purposes relevant to the invention. In addition, the term "capacitor" as used herein refers to a storage node in the architecture of dynamic random access memory (DRAM). It may have different names in other electronic components or memory architecture.

In the figures of the present invention, FIGS. 1-6 are schematic views sequentially illustrating the steps of manufacturing a semiconductor device, wherein FIGS. 1A, 2A, 3A, 4A, 5A and 6A are schematic top views sequentially illustrating the steps of manufacturing a semiconductor device with the layout of various components distributed on a semiconductor plane in accordance with one embodiment of the present invention, and FIGS. 1B, 2B, 3B, 4B, 5B and 6B are schematic cross-sectional views taken along the section lines A-A' respectively in the corresponding FIGS. 1A, 2A, 3A, 4A, 5A and 6A, which sequentially illustrating the steps of manufacturing a semiconductor device with the connection between components and layer structures.

Figure 1B:
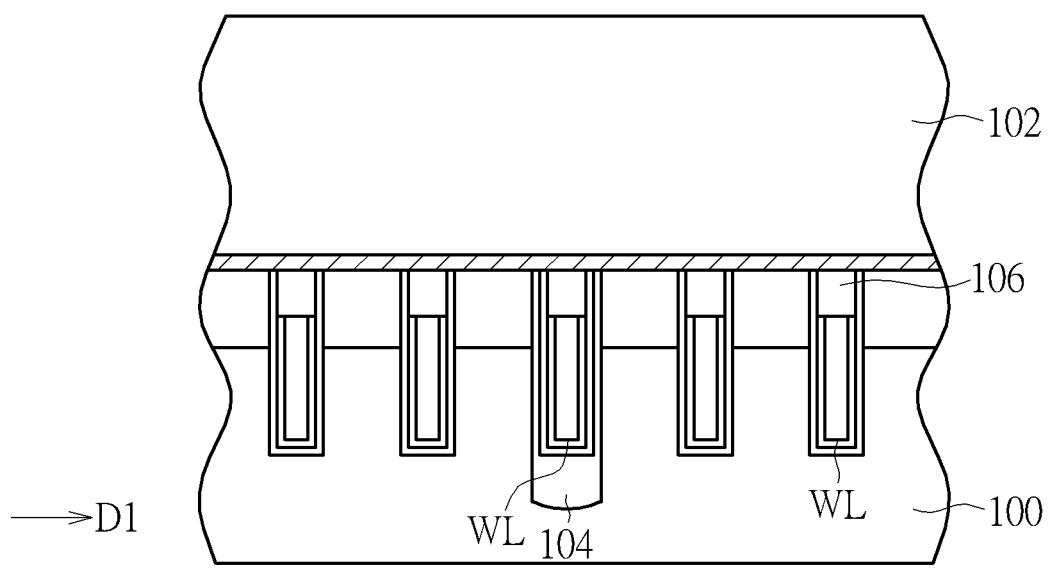
FIGS. 1B, 2B, 3B, 4B, 5B and 6B are schematic cross-sectional views sequentially illustrating the steps of manufacturing a semiconductor device in accordance with one embodiment of the present invention.

Please refer to FIG. 1A and FIG. 1B. The steps in the method of present invention include preparing a semiconductor substrate 100, such as a silicon wafer. In the architecture of dynamic random access memory (DRAM), the substrate 100 is generally defined into cell regions for setting up memory cells and peripheral regions for setting up circuits and interconnections. Since the subject of present invention is directed to the process performed in the cell regions, layouts in the peripheral regions and relevant detail description will be herein omitted in case of obscuring the focus and essential technical features of the present invention.

In the embodiment of present invention, bit lines BL and word lines WL are formed in advance in the substrate 100. In buried gate architecture, bit lines BL are formed on a first insulating layer on the substrate 100, such as an interlayer dielectric (IDL) 102 with the material of silicon oxide. Multiple bit lines BL extend in a first direction D1 and are alternately arranged with the interlayer dielectric 102 in a second direction D2. Please note that bit lines BL shown in the top view of FIG. 1A may be a hard mask portion on the bit line, such as a silicon nitride layer, rather than the bit line itself, such as a tungsten layer. In order to facilitate the describing and understanding of the present invention, all those portions will be collectively referred hereinafter as bit line BL. The bit line BL would include bit line itself and the hard mask layer formed thereon.

Furthermore, in the buried gate architecture, word lines WL are generally buried in a predetermined depth within the substrate 100 and extend through isolation structures 104 and active regions (i.e. the substrate 100 in the embodiment) in a second direction D2 perpendicular to the first direction D1. That is, word lines WL and bit lines BL are perpendicularly interlaced in top view. The word line WL functions as a switch for controlling memory cells, with the material including but not limited to doped semiconductor materials (ex. doped silicon), metals (ex. tungsten, aluminum, titanium, tantalum), conductive metals (ex. titanium nitride, tantalum nitride or tungsten nitride), or metal-semiconductor compounds (ex. silicon nitride), etc. In the embodiment of present invention, each word line WL further includes an upper capping layer 106, which is an essential technical feature of the present invention and will be further described later.

Figure 2A:
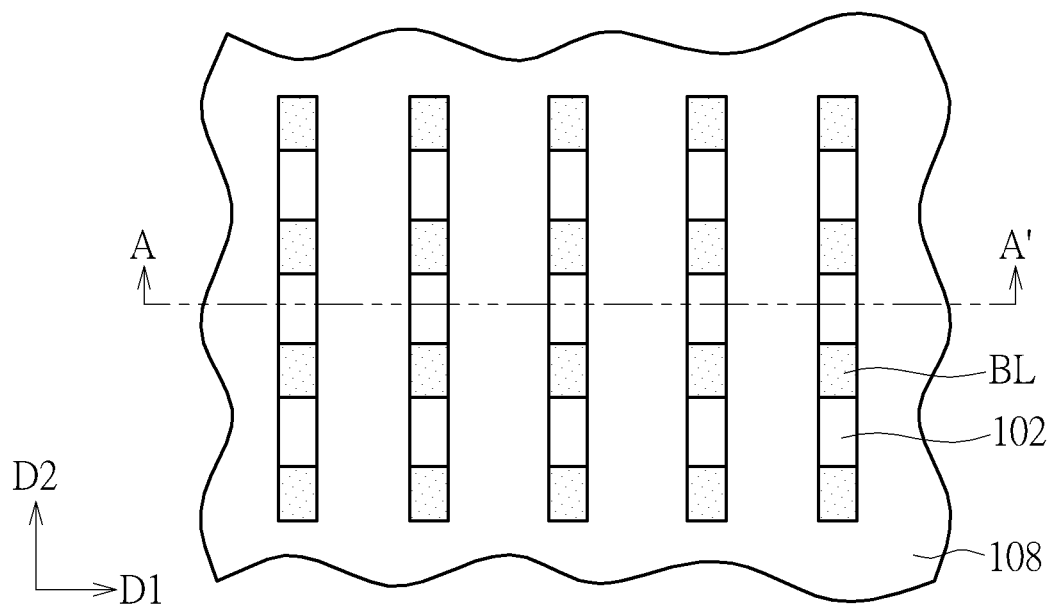
Figure 2B:
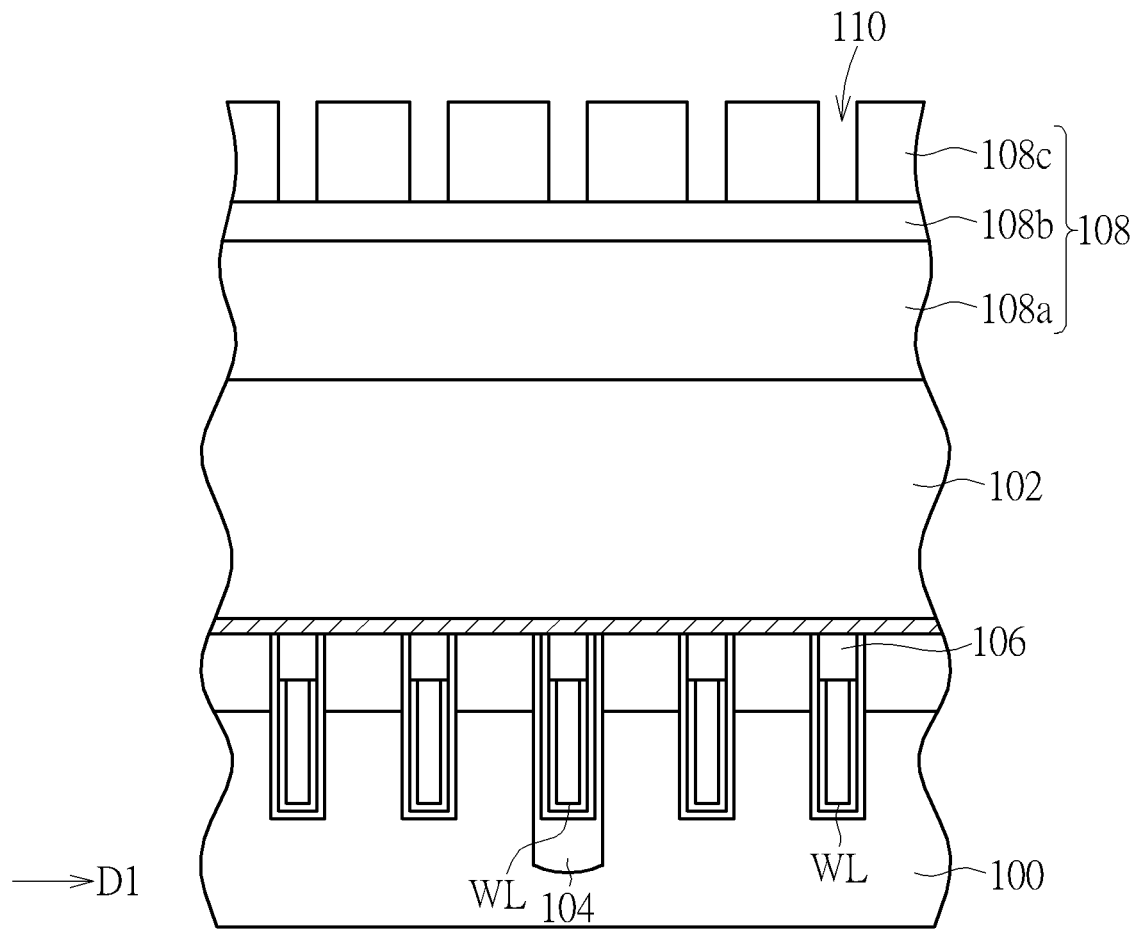

Please refer to FIG. 2A and FIG. 2B. After the substrate 100 with word lines WL and bit lines BL is prepared, a first mask pattern 108 is then formed on the substrate 100 to define the position of isolation structures to be formed in later process. In the embodiment of present invention, the first mask pattern 108 may be a multilayer dielectric layer (MDL), such as a tri-layer structure made up of organic dielectric layer (ODL) 108a, silicon-containing bottom anti-reflection coating 108b and photoresist 108c, but not limited thereto. The first mask patterns 108 formed in this step would extend in the second direction D2 and are spaced apart in the first direction D1, thereby exposing the interlayer dielectric 102 and bit lines BL thereunder. Please note that in this embodiment, the portions exposed from the first mask patterns 108, as the openings 110 shown in FIG. 2B, would correspond to the word lines WL within the substrate, since the isolation structures to be formed in a later process is predetermined to be formed on word lines WL.

Figure 3A:
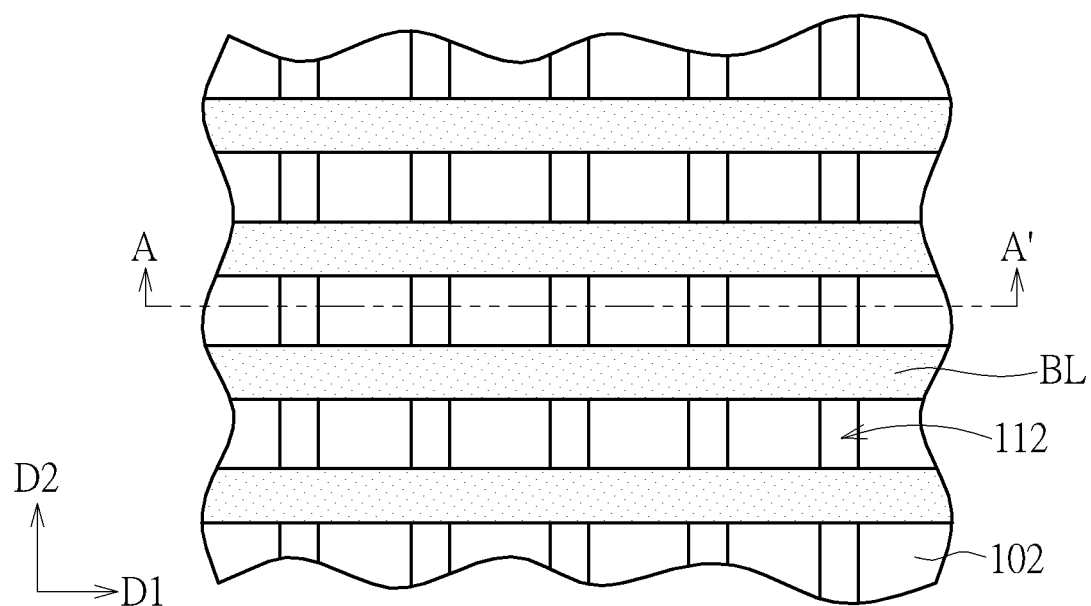
Figure 3B:
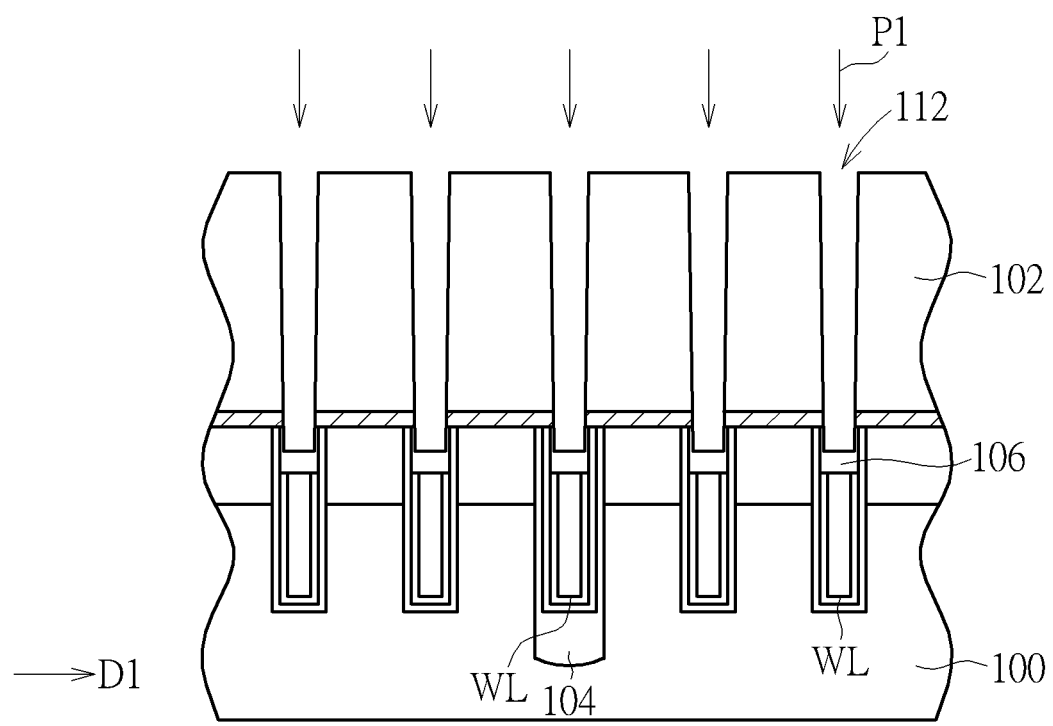

Please refer to FIG. 3A and FIG. 3B. After the first mask pattern 108 is formed on interlayer dielectric 102 and bit lines BL, a first etch process, such as an anisotropic etch process, is then performed using the first mask pattern 108 as an etch mask to remove the exposed interlayer dielectric 102, and the first mask pattern 108 is removed after the etch process. In this way, multiple recesses 112 in ordered array are formed in the interlayer dielectric 102. Every recess 112 is defined by bit lines BL extending in the first direction D1 and etched interlayer dielectric 102. Please note that in the embodiment of present invention, as shown in FIG. 3B, the first etch process would simultaneously remove the portion of capping layer 106 on the word lines WL, so that the recesses 112 would extend into the capping layer 106. This may help to steady the isolation structures to be formed in later process.

Furthermore, another essential feature of the present invention is that a surface treatment process P1 will be performed to the surface of those recesses 112 after the recesses 112 are formed. The surface treatment process P1 includes a low oxygen/no oxygen ashing process, dilute hydrofluoric acid (dHF) cleaning process, soft etch cleaning process, or surface nitriding process, etch. This surface treatment process P1 is meant to reduce the oxygen affinity, and the same time, increase the nitrogen affinity of the recess surface. In prior art, silicon nitride based isolation structures have poor affinity with surrounding silicon oxide based interlayer dielectric 102 due to their different materials, thus the isolation structures formed therein are quite unsteady. Through the surface treatment process P1, the nitrogen affinity of the recess surface will be increased, and the affinity between the recess surface and the isolation structures formed thereon will also be increased, thus the isolation structures will be less easy to be peeled off after the supporting interlayer dielectric 102 is removed, and the predetermined patterns will not be damaged.

Figure 4A:
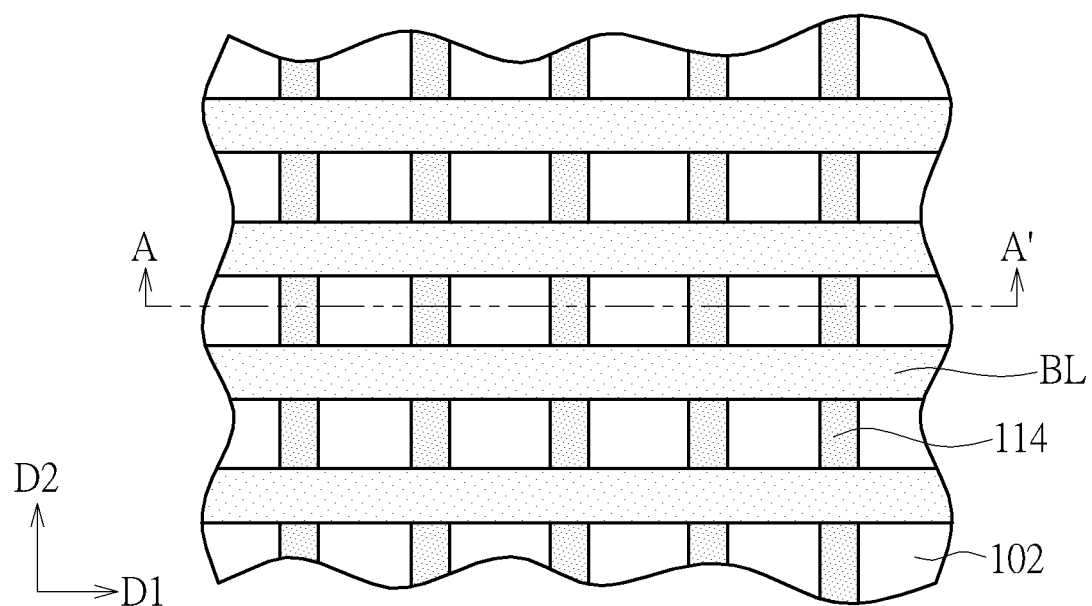
Figure 4B:
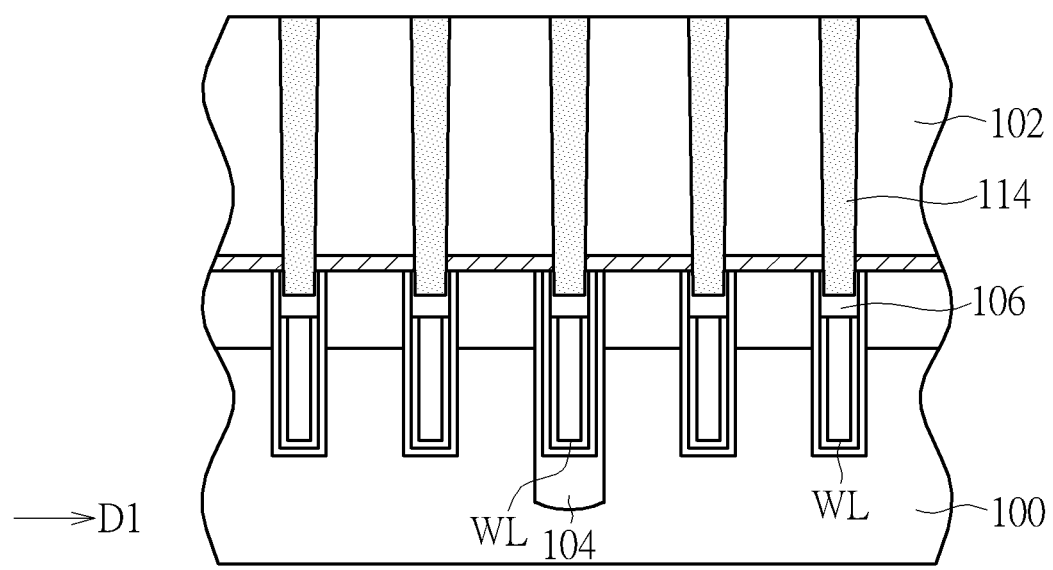

Please refer to FIG. 4A and FIG. 4B. After recesses 112 are formed and the surface treatment process P1 is performed, the recesses 112 are then filled up with a second insulating layer to form isolation structures 114. The process may include the step of depositing a second insulating layer with the material of silicon nitride, silicon carbonitride, or boron-doped silicon carbonitride, to cover entire surface of substrate and fill up the recesses 112. An etch process is then performed to remove the second insulating layer outside the recesses 112 to expose the interlayer dielectric 102 and the bit lines BL, thereby forming the plug-like isolation structures 114 only in the recesses 112. In the embodiment of the present invention, the materials of isolation structure 114 and surrounding capping layer of the bit line BL may be the same, and the materials of isolation structure 114 and surrounding silicon oxide based interlayer dielectric 102 are different. Since the surface treatment process P1 is performed in advance, the affinity of silicon nitride based isolation structure 114 formed in the recesses 112 with surrounding interlayer dielectric 102 and bit line BL would be improved, so that the peeling issue of isolation structures 114 in the step of removing interlayer dielectric 102 is less likely to happen.

In addition, as it may be noted in FIG. 4B, since the previous first etch process would simultaneously remove a portion of capping layer 106, the isolation structure 114 formed in the recess would extend downwardly into the capping layer 106 of word line WL and contact therewith. In this way, the silicon nitride based capping layer 106 and the silicon nitride based isolation structure 114 contacting therewith would have good affinity, so as to provide an extraordinary steady isolation structure 114.

Furthermore, after the isolation structures 114 are formed, a boron ions implantation process may be performed to the isolation structures 114 to dope the isolation structure 114 with boron element. For example, in the case of isolation structure 114 with material of silicon carbonitride (SiCN), the material of boron-doped isolation structure would be SiBCN. This may help to improve the electrical property and performance of final semiconductor products, such as providing high etch resistance, mitigating capacitance effect between wirings, preventing the device heating, and preventing the device leakage, etc.

Figure 5A:
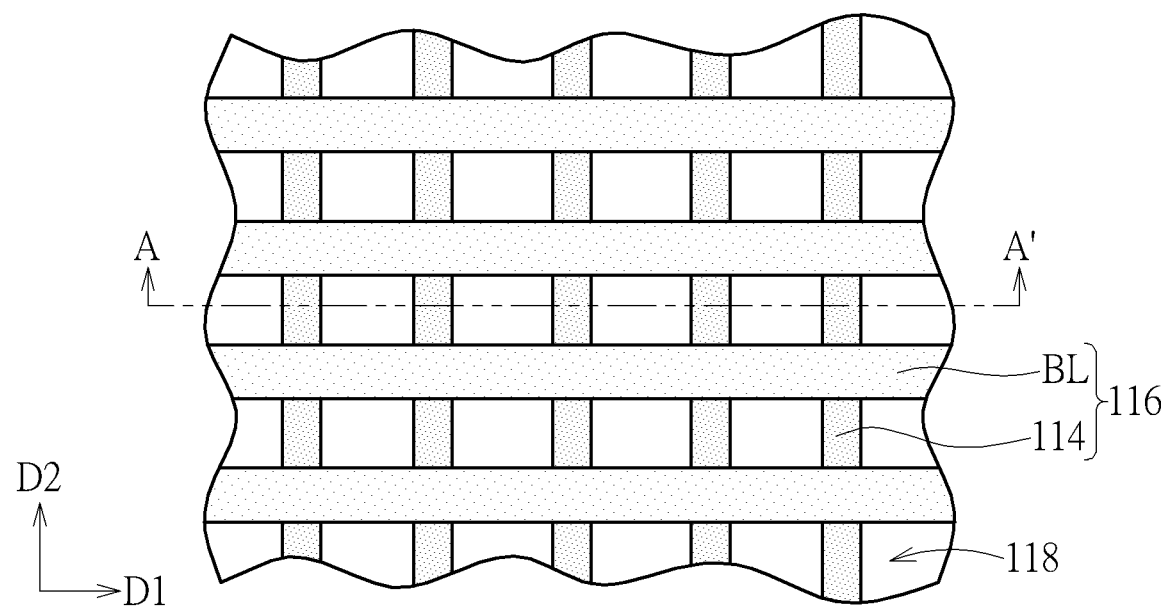
Figure 5B:
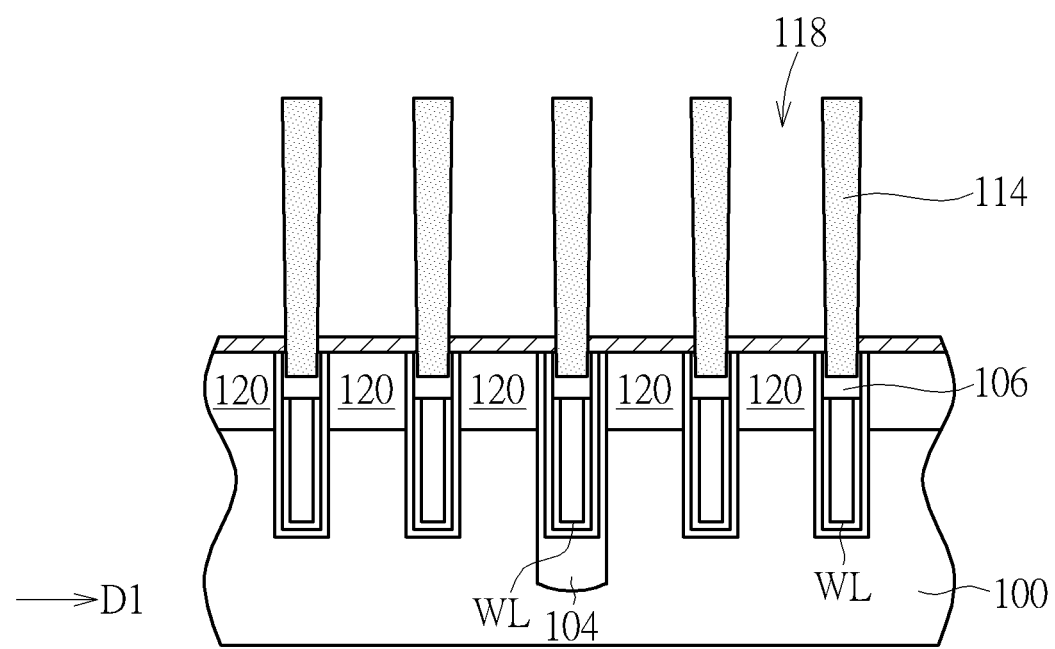

Please refer to FIG. 5A and FIG. 5B. After the isolation structures 114 are formed, a second etch process (ex. a bottom oxide etch process) is then performed to remove the interlayer dielectric 102 surrounding the isolation structures 114. Only the isolation structures 114 and bit lines BL remain after the process, thereby forming a mesh-type isolation structure 116 on the substrate. In the embodiment of present invention, mesh-type isolation structure 116 is made up of the bit lines BL extending in the first direction D1 and the plug-like isolation structures 114 with multiple openings 118 defined therebetween. Theses openings 118 expose the positions of corresponding storage nodes thereunder, such as an epitaxial layer with preformed source region, and they also define the positions of contact plug to be formed in later process.

Figure 6A:
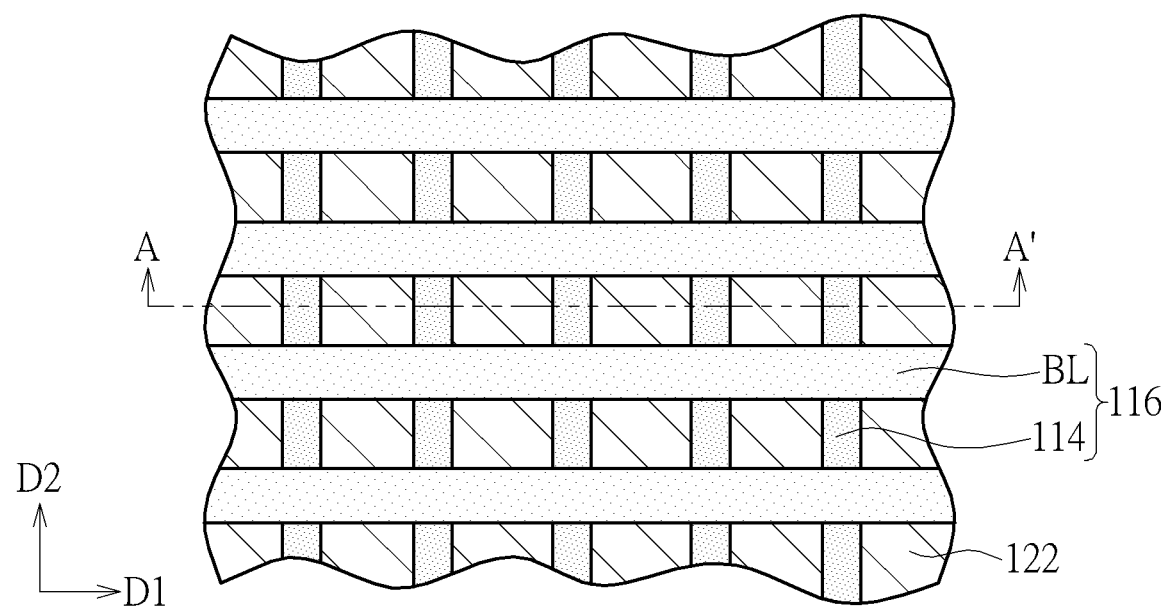
Figure 6B:
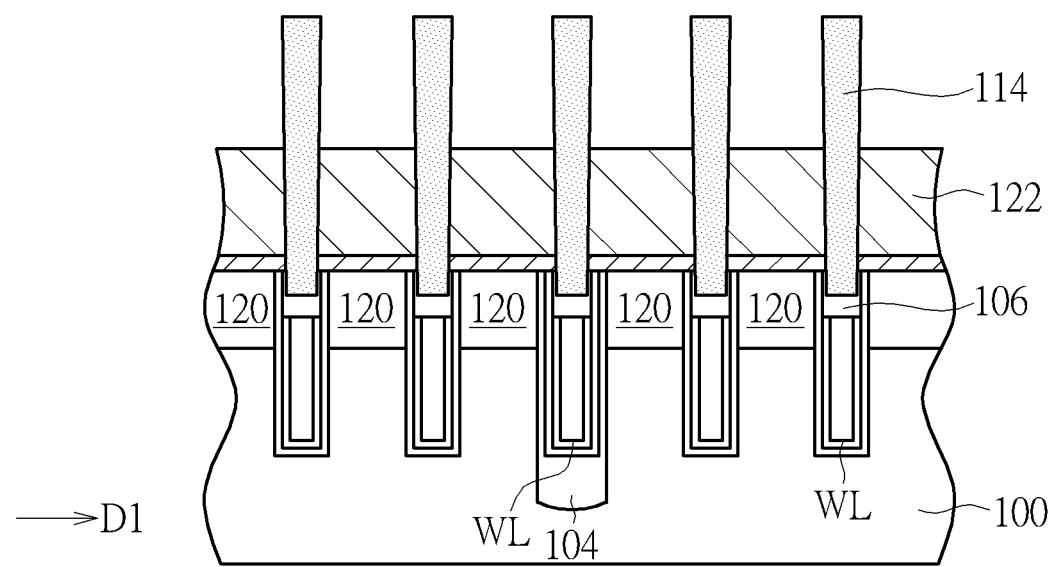

Please refer to FIG. 6A and FIG. 6B. After the mesh-type isolation structure 116 is formed, storage node contact plugs 122, (ex. tungsten contact plugs) are then formed in the openings 118. Each storage node contact plug 122 is electrically connected with the storage node 120 thereunder. A barrier layer may be optionally formed surrounding the storage node contact plug 122 to provide barrier effect therebetween. The material of barrier layer may be an amorphous layer or a metal silicide layer, but not limited thereto. After the storage node contact plugs 122 are formed, the process of manufacturing storage node landing pads and capacitors may go on. Since these components are not essential features of the present invention, relevant detail description will be herein omitted in case of obscuring the focus and essential technical features of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing semiconductor devices, comprising:
providing a substrate with at least one cell region defined on said substrate, said substrate further comprises a first insulating layer, and multiple bit lines are provided in said first insulating layer in said cell region, and said bit lines extend in a first direction and are spaced apart from each other in a second direction perpendicular to said first direction;
forming first mask patterns on said substrate, wherein said first mask patterns extend in said second direction and are spaced apart from each other in said first direction, and a portion of said first insulating layer is exposed from said first mask patterns;
after said first mask patterns are formed, removing exposed said first insulating layer to form multiple recesses in said first insulating layer;
performing a surface treatment process to the surface of said recesses;
after said surface treatment process is performed, filling up said recesses with a second insulating layer and exposing a portion of said first insulating layer, wherein the materials of said second insulating layer and said first insulating layer are different;
after filling said second insulating layer, removing exposed said first insulating layer to form a mesh-type isolation structure on said substrate, wherein said mesh-type isolation structure defines multiple openings; and
forming storage node contact plugs respectively in said openings.

2. The method of manufacturing semiconductor devices of claim 1, wherein said surface treatment process comprises low oxygen/no oxygen ashing process, dilute hydrofluoric acid cleaning process, soft etch cleaning process, or surface nitriding process.

3. The method of manufacturing semiconductor devices of claim 1, further comprising performing an etch process to remove a portion of said second insulating layer after filling said second insulating layer, thereby exposing said portion of said first insulating layer.

4. The method of manufacturing semiconductor devices of claim 1, wherein said mesh-type isolation structure is made up of said second insulating layer and said bit lines.

5. The method of manufacturing semiconductor devices of claim 1, wherein said openings overlap multiple word lines in said substrate.

6. The method of manufacturing semiconductor devices of claim 1, wherein said first insulating layer is silicon oxide.

7. The method of manufacturing semiconductor devices of claim 1, wherein the material of said second insulating layer is silicon nitride, silicon carbonitride, or boron-doped silicon carbonitride.

8. A method of manufacturing semiconductor devices, comprising:
providing a substrate, wherein at least one cell region is defined on said substrate, said substrate further comprises a first insulating layer, and multiple bit lines are provided in said first insulating layer in said cell region, and said bit lines extend in a first direction and are spaced apart from each other in a second direction perpendicular to said first direction, said substrate in said cell region further comprises multiple word lines extending in said second direction and spaced apart from each other in said first direction, and each said word line comprises a capping layer;
forming first mask patterns on said substrate, wherein said first mask patterns extend in said second direction and are spaced apart from each other in said first direction, and a portion of said first insulating layer is exposed from said first mask patterns;
after said first mask patterns are formed, performing a first etch process with said first mask patterns as an etch mask to remove exposed said first insulating layer, thereby forming multiple recesses in said first insulating layer, wherein said first etch process simultaneously removes a portion of said capping layer of said word lines so that said recesses extend into said capping layer;
filling up said recesses with a second insulating layer, wherein said second insulating layer extends into said capping layer and exposes a portion of said first insulating layer, and the materials of said second insulating layer and said first insulating layer are different;
after filling said second insulating layer, removing exposed said first insulating layer to form a mesh-type isolation structure on said substrate, wherein said mesh-type isolation structure extends into said capping layer and defines multiple openings; and
forming storage node contact plugs respectively in said openings.

9. The method of manufacturing semiconductor devices of claim 8, further comprising performing a second etch process to remove a portion of said second insulating layer after filling said second insulating layer, thereby exposing said portion of said first insulating layer.

10. The method of manufacturing semiconductor devices of claim 8, wherein the material of said first insulating layer is silicon oxide.

11. The method of manufacturing semiconductor devices of claim 8, wherein the material of said second insulating layer is silicon nitride, silicon carbonitride, or boron-doped silicon carbonitride.

* * * * *